(12) United States Patent
Kitano

(10) Patent No.: US 12,394,617 B2
(45) Date of Patent: Aug. 19, 2025

(54) MANUFACTURING METHOD OF SEMICONDUCTOR APPARATUS

(71) Applicant: FUJI ELECTRIC CO., LTD., Kanagawa (JP)

(72) Inventor: Michiya Kitano, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 417 days.

(21) Appl. No.: 17/679,010

(22) Filed: Feb. 23, 2022

(65) Prior Publication Data

US 2022/0344149 A1    Oct. 27, 2022

(30) Foreign Application Priority Data

Apr. 21, 2021 (JP) ................................. 2021-071773

(51) Int. Cl.
| | | |
|---|---|---|
| *H01L 21/302* | (2006.01) | |
| *H01L 21/02* | (2006.01) | |
| *H01L 21/461* | (2006.01) | |

(52) U.S. Cl.
CPC .. *H01L 21/02013* (2013.01); *H01L 21/02019* (2013.01)

(58) Field of Classification Search
CPC ......... H01L 21/02013; H01L 21/02019; H01L 21/30604–30621; H01L 21/30625; H01L 21/67075; H01L 21/6708; H01L 21/67092; H01L 21/67132; H01L 21/304; H01L 21/02002–02035; H01L 21/3046; H01L 21/463; H01L 21/465; H01L 21/3063–30635; H01L 21/3065–30655; H01L 21/31055–31056; H01L 21/31111–31138;
(Continued)

(56) References Cited

U.S. PATENT DOCUMENTS 10,074,611 B1*   9/2018 Grivna .................... H01L 21/78
2007/0141955 A1*  6/2007 Masuda ............. B24B 27/0076
451/41
(Continued)

FOREIGN PATENT DOCUMENTS

| JP | H03208342 A | 9/1991 |
|---|---|---|
| JP | 2007019461 A | 1/2007 |

(Continued)

OTHER PUBLICATIONS

Office Action issued for counterpart Japanese Application No. 2021-071773, transmitted from the Japanese Patent Office on Feb. 4, 2025 (drafted on Jan. 28, 2025).

*Primary Examiner* — Niki H Nguyen

(57) ABSTRACT

Provided is a manufacturing method of semiconductor apparatus comprising a semiconductor substrate, the method comprising: grinding a first surface of the semiconductor substrate to form an outer peripheral surplus region on an outer periphery of the semiconductor substrate; and spin etching the first surface of the semiconductor substrate by a chemical liquid, and wherein after the grinding, in a region of the semiconductor substrate which is closer to an inner side than the outer peripheral surplus region, a thickness of the semiconductor substrate in an end portion of the region is greater than a thickness of the semiconductor substrate in a center portion of the region.

15 Claims, 19 Drawing Sheets

(58) Field of Classification Search
CPC ... H01L 21/32133–32139; H01L 2221/68327; B24B 37/042; B24B 37/10; B24B 7/228
See application file for complete search history.

(56) References Cited

U.S. PATENT DOCUMENTS

| | | | | |
|---|---|---|---|---|
| 2009/0020854 A1* | 1/2009 | Feng | ................ | H01L 21/02013 |
| | | | | 438/459 |
| 2013/0052812 A1* | 2/2013 | Nakata | ................ | H01L 21/304 |
| | | | | 438/692 |
| 2018/0102410 A1* | 4/2018 | Shibata | ................ | H01L 21/304 |

FOREIGN PATENT DOCUMENTS

| | | |
|---|---|---|
| JP | 2008060470 A | 3/2008 |
| JP | 2009279661 A | 12/2009 |

* cited by examiner

MANUFACTURING METHOD OF SEMICONDUCTOR APPARATUS

The contents of the following Japanese patent application are incorporated herein by reference:
NO. 2021-071773 filed in JP on Apr. 21, 2021.

BACKGROUND

1. Technical Field

The present invention relates to a manufacturing method of a semiconductor apparatus.

2. Related Art

Conventionally, in a semiconductor substrate processing method, a technology for "grinding only a back surface corresponding to a device region of a wafer to form a ring-shaped reinforcement portion on an outer periphery of a back surface corresponding to an outer peripheral surplus region surrounding the device region" is known (For example, see Patent Document 1 and Patent Document 2).

Patent Document 1: Japanese Patent Application Publication No. 2007-19461
Patent Document 2: Japanese Patent Application Publication No. 2008-60470

DESCRIPTION OF EXEMPLARY EMBODIMENTS

Figure 1:
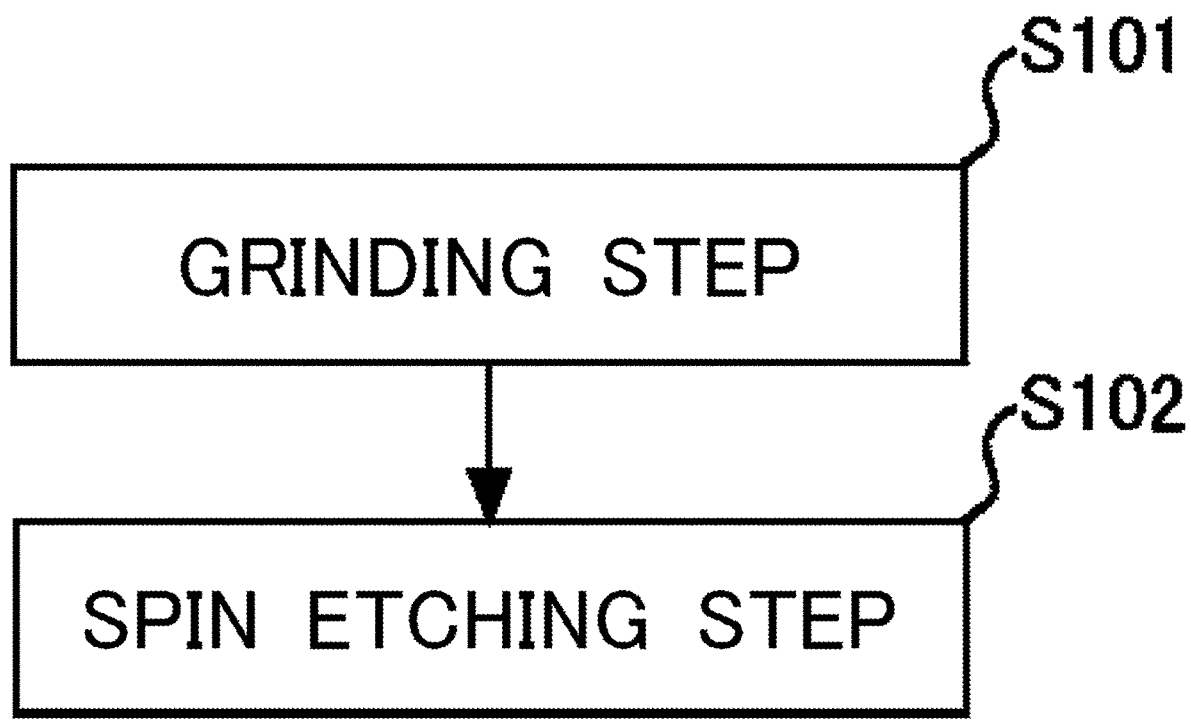
FIG. 1 is a diagram describing one example of a manufacturing method of a semiconductor apparatus 100.

Hereinafter, the present invention will be described through embodiments of the invention, but the following embodiments do not limit the invention according to claims. In addition, not all combinations of features described in the embodiments are essential to the solution of the invention. Note that, in the present specification and the drawings, a repeated description for an element having a substantially same function and configuration is omitted by providing a same reference numeral, and illustration of an element which is not directly associated with the present invention is omitted. Also, in one drawing, an element having the same function and configuration may be provided with a representative reference numeral, omitting the reference numerals for the others.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. An "upper" and "lower" direction is not limited to a direction of gravity, or a direction at the time in which the semiconductor module is implemented.

In the present specification, technical matters may be described using orthogonal coordinate axes of an X axis, a Y axis, and a Z axis. The orthogonal coordinate axes merely identify relative positions of the components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis. In the present specification, orthogonal axes parallel to the upper surface and the lower surface of the semiconductor substrate are referred to as an X axis and a Y axis. In addition, an axis perpendicular to the upper surface and the lower surface of the semiconductor substrate is referred to as a Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

FIG. 1 is a diagram describing one example of a manufacturing method of a semiconductor apparatus 100. A manufacturing method of the semiconductor apparatus 100 includes a grinding step S101 and a spin etching step S102.

Figure 2:
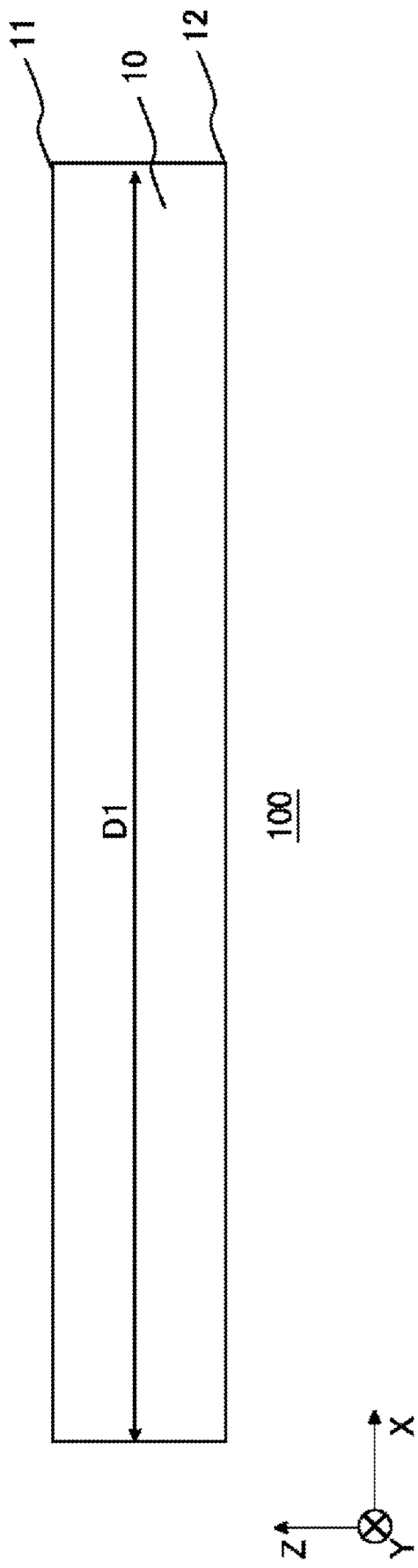
FIG. 2 is a diagram showing one example of the semiconductor apparatus 100.

FIG. 2 is a diagram showing one example of the semiconductor apparatus 100. The semiconductor apparatus 100 functions as, as one example, a power conversion apparatus such as an inverter. The semiconductor apparatus 100 may include a diode such as insulated gate bipolar transistor (IGBT), FWD (Free Wheel Diode) and RC (Reverse Conducting)—IGBT provided by combining the two, and a MOS transistor or the like. It may not be limited to those examples.

The semiconductor apparatus 100 includes a semiconductor substrate 10. The semiconductor substrate 10 in the present example is a wafer whose shape seen from top is almost circular shape. In the present specification, processes except for a process for grinding the semiconductor substrate 10 are omitted. The manufacturing method of the semiconductor apparatus 100 may include: a process for implanting an impurity to a predetermined area of the semiconductor substrate 10; a process for annealing the semiconductor substrate 10; and a process for forming an insulating film, electrode or wiring or the like on a front surface of the semiconductor substrate 10. By those processes, a semiconductor device such as a transistor is formed on the semiconductor substrate 10. The semiconductor substrate 10 is a substrate formed of a semiconductor material. As one example, the semiconductor substrate 10 is a silicon substrate, but a material of the semiconductor substrate 10 is not limited to silicon. As a diameter D1 of the semiconductor substrate 10, 200±5 mm or 300 mm±5 mm is frequently used as one example. However, it is not limited to this value. In the present example, the diameter D1 of the semiconductor substrate 10 is 300 mm or more. A wafer in which the diameter D1 of the semiconductor substrate 10 is 300 mm or more is referred to as a large-diameter wafer. However, the diameter D1 of the semiconductor substrate 10 may be 200 mm±5 mm. Also, the semiconductor substrate 10 has a first surface 11 and a second surface 12.

The second surface 12 of the semiconductor substrate 10 may be a surface in which a gate structure such as IGBT or MOS transistor is formed. The gate structure is, for example, a structure including at least one of a gate metal layer, a gate insulating film, a source region, an emitter region and a channel region. In the grinding step S101, the second surface 12 may be in a state in which the gate structure is formed or not yet formed thereon. The second surface 12 of the semiconductor substrate 10 may be a so-called device surface.

The first surface 11 of the semiconductor substrate 10 may be a surface on the opposite side to the second surface 12 of the semiconductor substrate 10. In the present example, the first surface 11 of the semiconductor substrate 10 is a surface processed in the grinding step S101 and the spin etching step S102. Firstly, for the description purpose, a comparative example of the grinding step S101 and a comparative example of the spin etching step S102 are described.

Figure 3A:
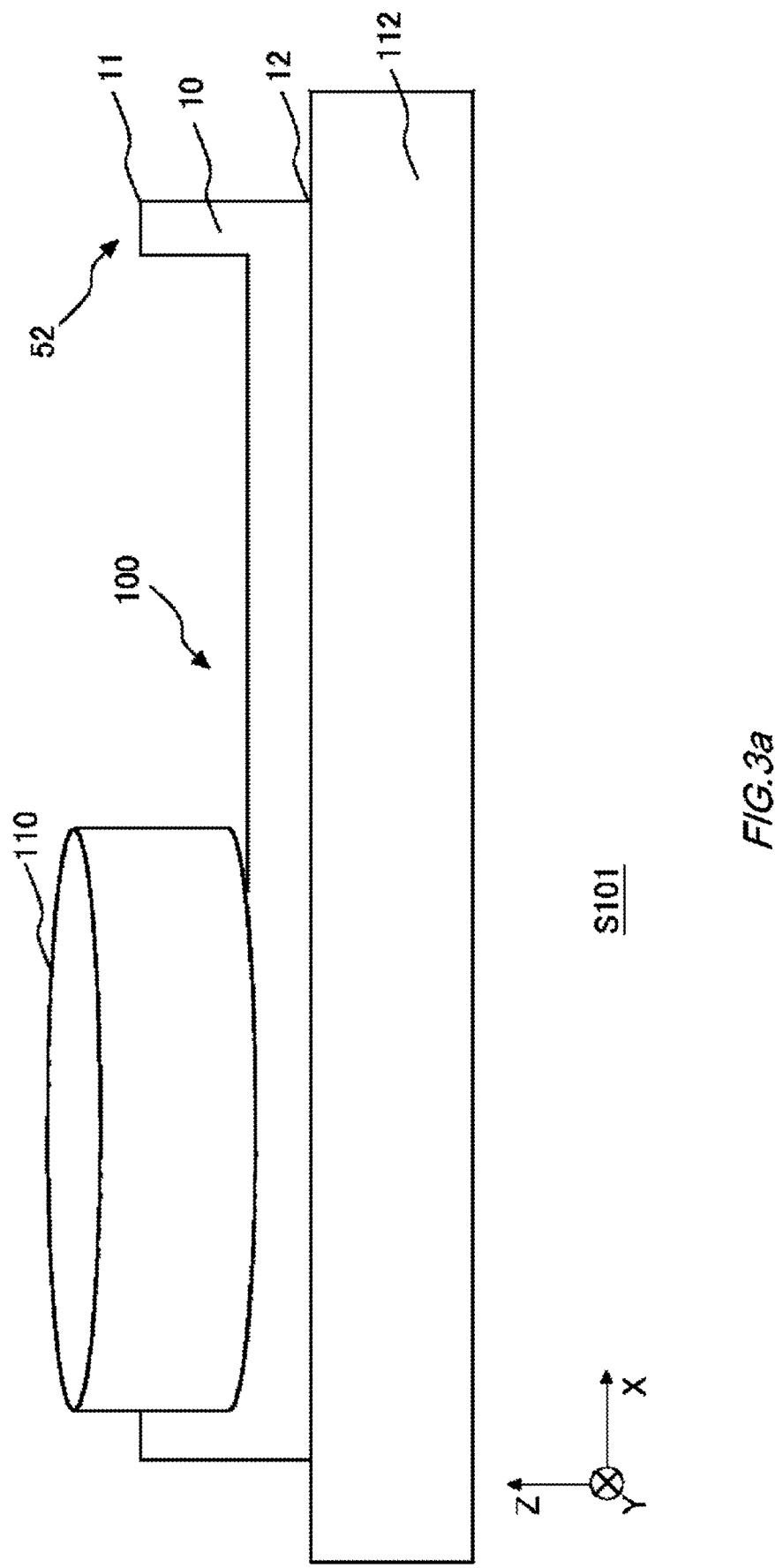
FIG. 3a is a diagram describing the semiconductor apparatus 100 in the middle of the grinding in a grinding step S101.
Figure 3B:
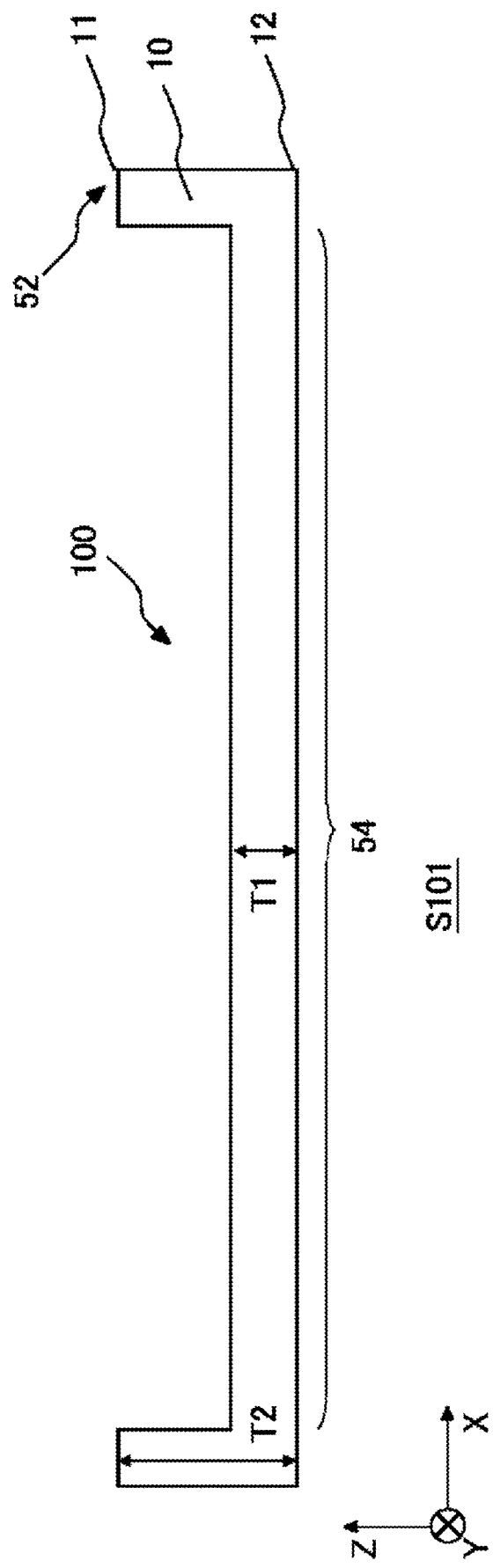
FIG. 3b is a diagram describing the semiconductor apparatus 100 after the grinding in the grinding step S101.

FIG. 3a and FIG. 3b are diagrams describing the comparative examples of the grinding step S101. FIG. 3a is a diagram describing the semiconductor apparatus 100 in the middle of the grinding in a grinding step S101. FIG. 3b is a diagram describing the semiconductor apparatus 100 after the grinding in the grinding step S101.

In the grinding step S101, the first surface 11 of the semiconductor substrate 10 is ground. In the grinding step s101, the semiconductor substrate 10 is supported by a table 112. In the FIG. 3a, the second surface 12 of the semiconductor substrate 10 is supported by the table 112. The table 112 may be a chuck table. Note that a protection tape may be provided between the second surface 12 of the semiconductor substrate 10 and the table 112. By providing the protection tape between the second surface 12 of the semiconductor substrate 10 and the table 112, the second surface 12 of the semiconductor substrate 10 can be protected. As the protection tape, for example an adhesive tape such as a pressure sensitive tape or UV tape is frequently used, but an organic coating film such as a resist, an electrostatic adsorption sheet, or a supporting circular plate with an adhesive coated thereon or the like can be used besides the adhesive tape. When the protection tape is provided between the second surface 12 of the semiconductor substrate 10 and the table 112, a protection tape peeling step may be provided after the grinding step S101 or after the spin etching step S102.

In the grinding step S101, the first surface 11 of the semiconductor substrate 10 is ground by a whetstone 110. The grinding step S101 is performed using a grinding apparatus such as a back grinder (BG), for example. Also, in the grinding step S101, the whetstone 110 is rotated. The number of rotations of whetstone 110 for every one minute (rotations per minute) is, as one example, 2000~4000 rpm. The whetstone 110 may perform grinding by moving parallel to the Z axis while rotating. The whetstone 110 may also move in a radial direction when it performs grinding. Note that the grinding may be performed while rotating the semiconductor substrate 10 in the grinding step S101.

As shown in FIG. 3b, after the grinding step S101 according to the comparative example, the semiconductor substrate 10 is processed to have a uniform thickness T1. The thickness T1 may be considered uniform even if there is an error of 10% or more. In the present specification, the thickness is a difference between a height of the upper surface and a height of the lower surface in the Z axis direction. In FIG. 3b, the thickness T1 of the semiconductor substrate 10 is a difference between a height of the first surface 11 and a height of the second surface 12. In the present specification, the height is a height from a certain reference. In each figure, the reference may be a portion provided on the lowermost side in the Z axis direction among each component of the semiconductor apparatus 100. In FIG. 3b, the reference is the second surface 12 of the semiconductor substrate 10, for example.

In the present example, an outer peripheral surplus region 52 is formed on an outer periphery of the semiconductor substrate 10 in the grinding step S101. That is, in the grinding step S101, an inner side of the outer peripheral surplus region 52 is ground such that the outer peripheral surplus region 52 remains on the outer periphery of the semiconductor substrate 10. By causing the outer peripheral surplus region 52 to remain on the outer periphery, a ring-shaped reinforcement structure can remain on the semiconductor substrate 10. Accordingly, after the grinding step S101, a warpage of the semiconductor substrate 10 can be suppressed. Also, in a subsequent process in the grinding step S101, the semiconductor substrate 10 becomes easy to handle. A region of the semiconductor substrate 10 which is closer to an inner side than the outer peripheral surplus region 52 is referred to as a region 54. A shape of the outer peripheral surplus region 52 is described in detail in FIG. 10.

In the present example, a thickness of the semiconductor substrate 10 except for the outer peripheral surplus region 52 is referred to as T1. T1 may be a thickness of the semiconductor substrate 10 in the region 54. In addition, in the present example, a thickness of the semiconductor substrate 10 on the outer peripheral surplus region 52 is T2. T2 may be a maximum thickness of the semiconductor substrate 10 in the outer peripheral surplus region 52. A grinding depth in the grinding step S101 may be a difference between T2 and T1. The grinding depth in the grinding step S101 may be 400 μm or more. Since a strength of the semiconductor substrate 10 increases as T2 increases, T2 is preferred to have a thickness as thick as possible. Since T1 requires to be set to a required thickness according to a breakdown voltage of the semiconductor apparatus, T1 is 50~300 μm, as one example. Also, T2 may be about 700 μm. Accordingly, the grinding depth in the grinding step S101 is 400 μm or more.

Figure 4A:
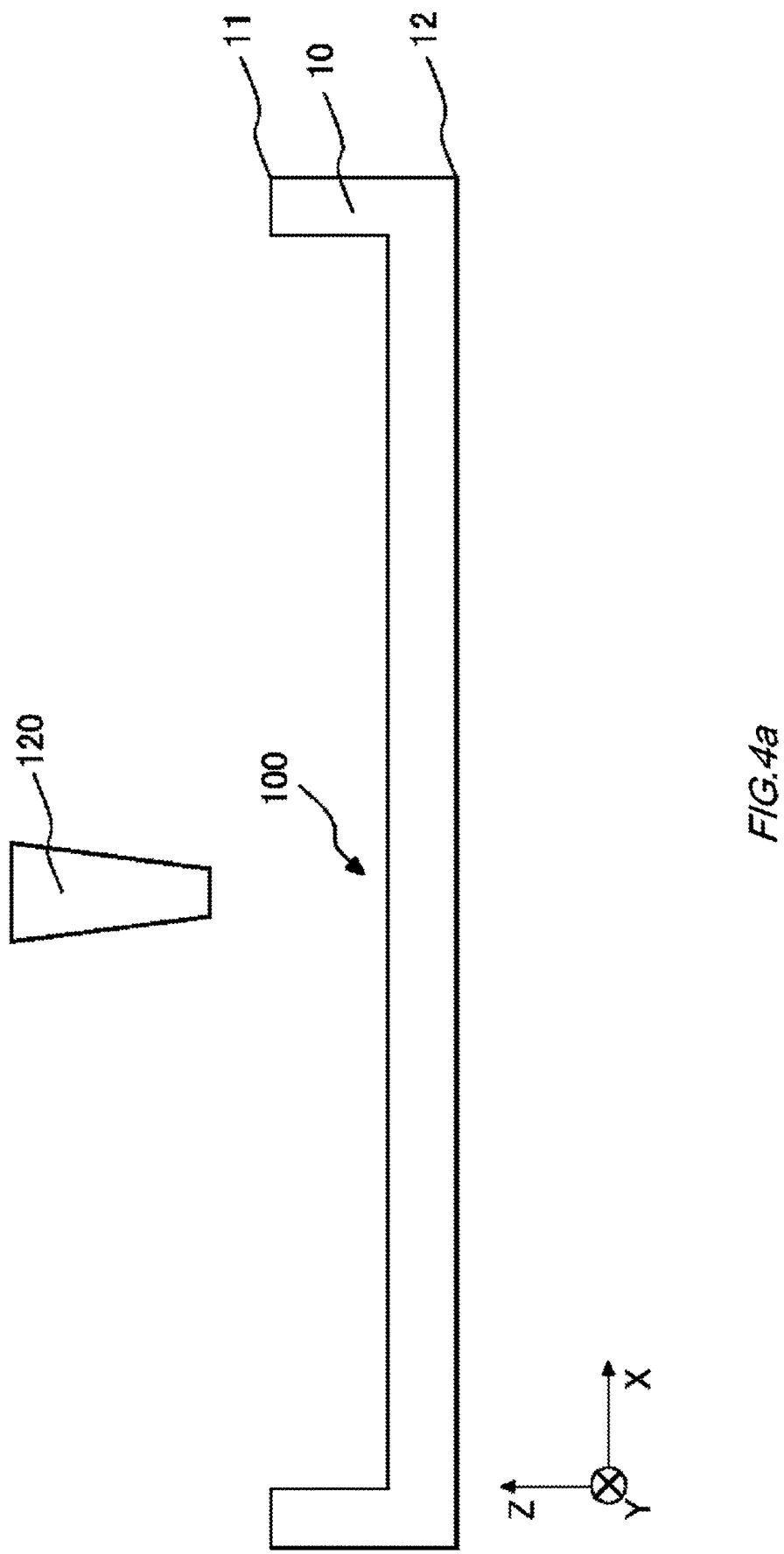
FIG. 4a is a diagram describing the semiconductor apparatus 100 in the middle of a processing in a spin etching step S102.
Figure 4B:
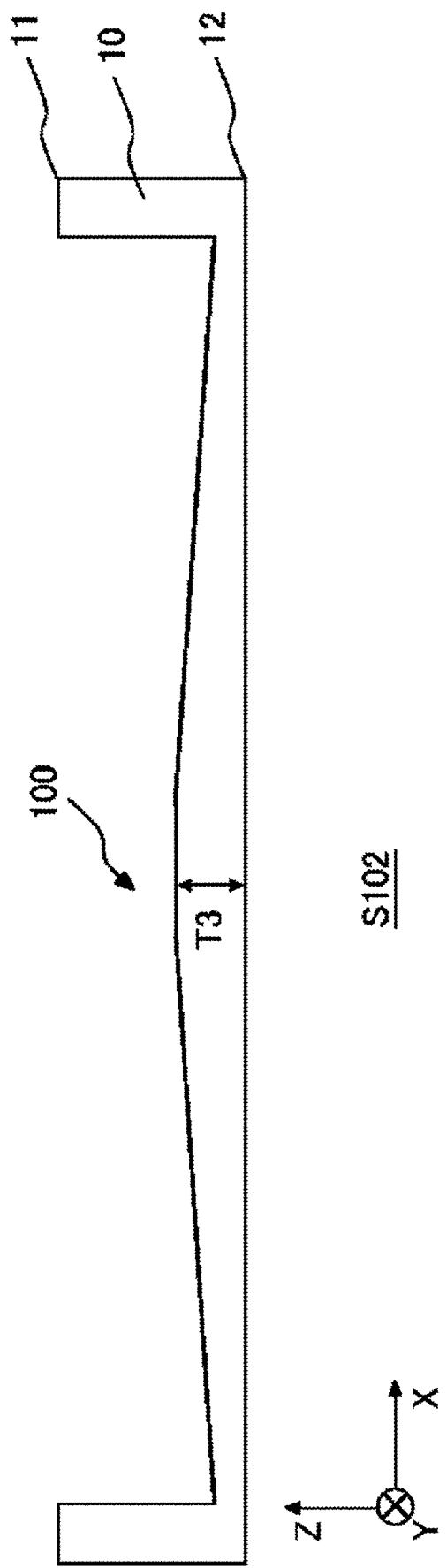
FIG. 4b is a diagram describing the semiconductor apparatus 100 after the processing in the spin etching step S102.

FIG. 4a and FIG. 4b are diagrams describing the comparative examples of the spin etching step S102. FIG. 4a is a diagram describing the semiconductor apparatus 100 in the middle of a processing in a spin etching step S102. FIG. 4b is a diagram describing the semiconductor apparatus 100 after the processing in the spin etching step S102.

In the spin etching step S102, the first surface 11 of the semiconductor substrate 10 is etched by using a chemical liquid. A chemical liquid which is used in the spin etching step S102 is referred to as a chemical liquid A. The chemical liquid A may be a chemical liquid for etching the semiconductor substrate 10. In the present example, the chemical liquid A is a silicon etching solution. The silicon etching solution is a fluonitric acid or a mixture including fluonitric acid, for example. The silicon etching solution may be a commercially available chemical liquid. In FIG. 4a, an apparatus 120 may eject the chemical liquid A to the first surface 11 of the semiconductor substrate 10. The apparatus 120 may have a nozzle for ejecting the chemical liquid A.

It is known that, after performing the grinding step S101, a processing distortion layer with a thickness of a few μm~tens of μm remains on the first surface 11 of the semiconductor substrate 10. The thickness of the processing distortion layer depends on an abrasive grain size of a whetstone which is used for the grinding step S101. Using a rough whetstone with large abrasive grain size causes a throughput of the grinding step S101 to improve, but it also causes the thickness of the processing distortion layer to increase. The processing distortion layer may cause a wafer cracking. Performing the spin etching step S102 can cause the processing distortion layer to be removed. Accordingly, the wafer cracking can be suppressed. As shown in FIG. 4b, after the spin etching step S102, the semiconductor substrate 10 is processed to have a thickness T3.

In the spin etching step S102, the semiconductor substrate 10 in a rotating state may be etched by using the chemical liquid A. A number of rotations of the semiconductor substrate 10 for every one minute is, as one example, in a range from 500 rpm to 1500 rpm. The greater the number of rotations of the semiconductor substrate 10, the better the uniformity of the etching, but if the number of rotations of the semiconductor substrate 10 exceeds 1500 rpm, a wafer breakage is easily occurred. The spin etching step S102 may be performed by a sheet type spin etching.

Before removing the processing distortion layer, the wafer cracking easily occurs. Therefore, in the spin etching step S102, the wafer cracking easily occurs if the semiconductor substrate 10 rotates at a high speed. This problem becomes significant for a large-diameter wafer with a diameter D1 of 300 mm or more. Accordingly, in a case of the large-diameter wafer, it is preferred to reduce the number of rotations of the semiconductor substrate 10 in the spin etching step S102.

Figure 5:
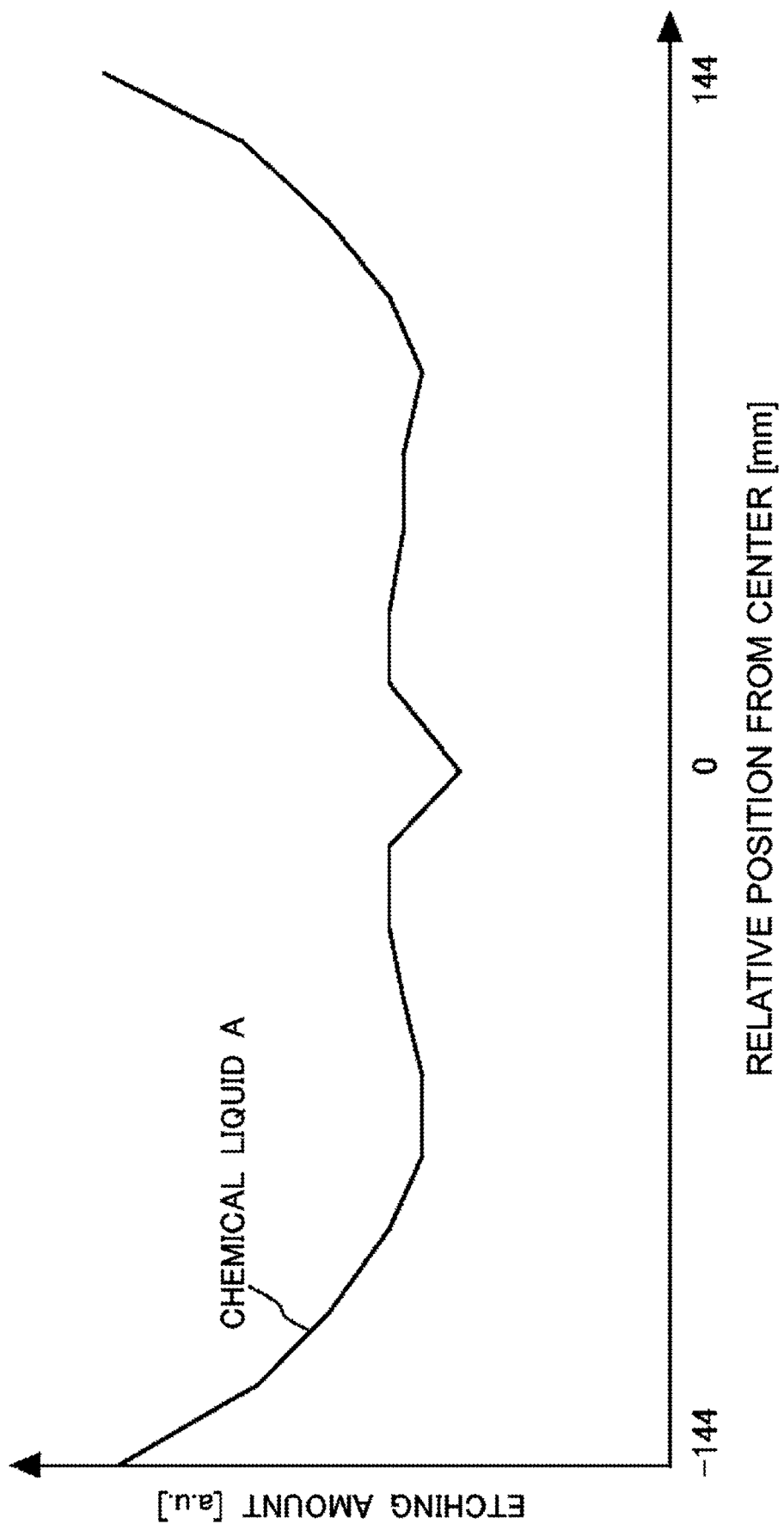
FIG. 5 is a diagram showing an etching amount within a surface of the semiconductor substrate 10 when the semiconductor substrate 10 is rotating at a low speed.

FIG. 5 is a diagram showing an etching amount within a surface of the semiconductor substrate 10 when the semiconductor substrate 10 is rotating at a low speed. In FIG. 5, a result of a case where the semiconductor substrate 10 is rotated at a low speed is shown with a solid line. A horizontal axis shows a relative position from a center of the semiconductor substrate 10, and a vertical axis shows an etching amount in the relative position. In the present example, the diameter D1 of the semiconductor substrate 10 is approximately 300 mm. Accordingly, a place whose relative position is 144 mm and −144 mm from the center of the semiconductor substrate 10 is in a vicinity of an outer periphery of the semiconductor substrate 10. A number of rotations of the semiconductor substrate 10 for every one minute in FIG. 5 is 500 rpm, as one example. As shown in FIG. 5, compared to a center side of the semiconductor substrate 10, the etching amount tends to increase on the outer peripheral side of the semiconductor substrate 10.

Figure 6:
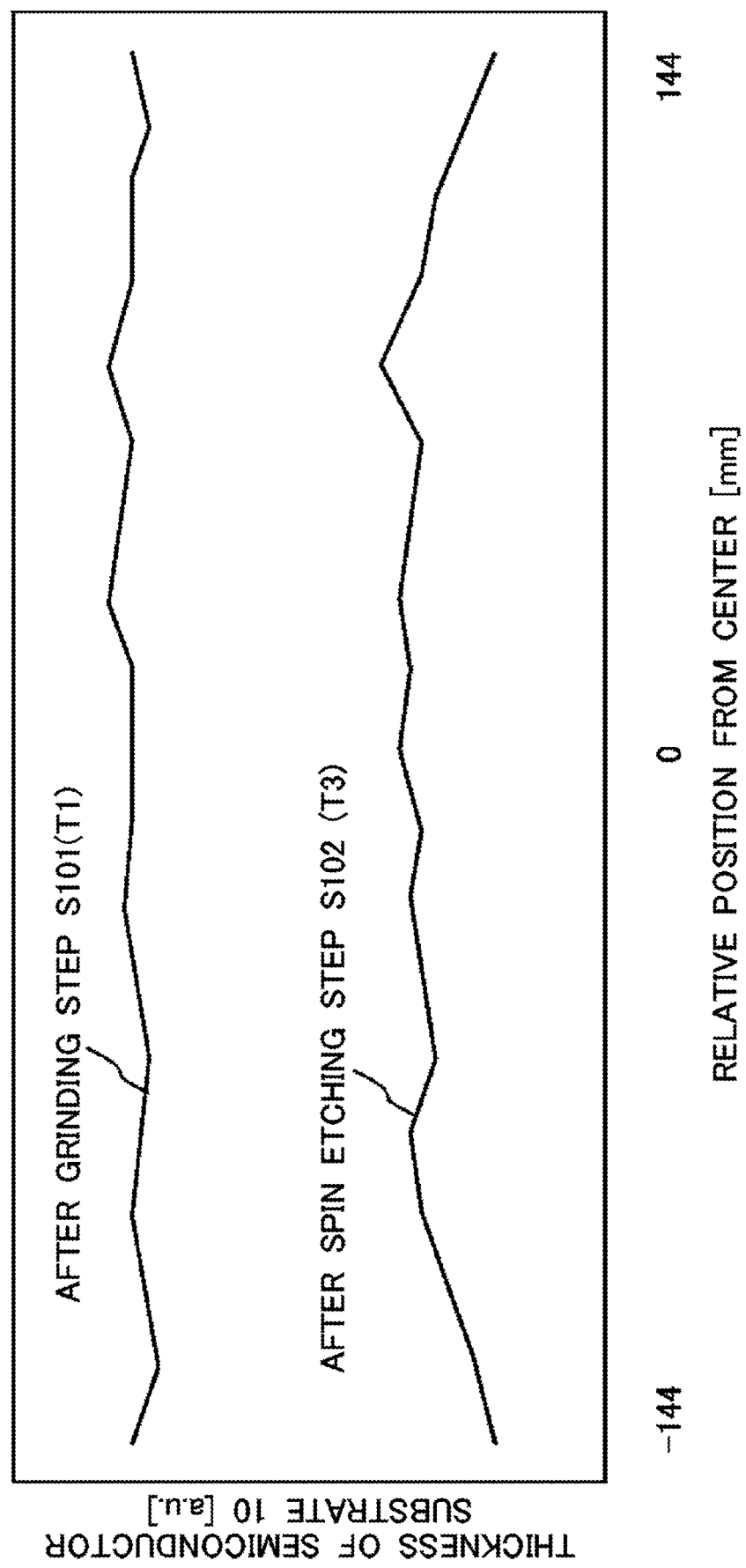
FIG. 6 is a diagram showing a thickness of the semiconductor substrate 10 after the grinding step S101 and after the spin etching step S102.

FIG. 6 is a diagram showing a thickness of the semiconductor substrate 10 after the grinding step S101 and after the spin etching step S102. A horizontal axis shows a relative position from a center of the semiconductor substrate 10, and a vertical axis shows a thickness of the semiconductor substrate 10 in the relative position. Also in FIG. 6, the number of rotations of the semiconductor substrate 10 for every one minute is 500 rpm. Note that the thickness of the semiconductor substrate 10 after the grinding step S101 may be the thickness T1 of FIG. 3b. The thickness of the semiconductor substrate 10 after the spin etching step S102 may be the thickness T3 of FIG. 4b.

After the spin etching step S102, the thickness of the semiconductor substrate 10 on the outer peripheral side of the semiconductor substrate 10 becomes thinner compared to after the grinding step S101. This is because, as described in FIG. 5, compared to a center side of the semiconductor substrate 10, the etching amount increases on the outer peripheral side of the semiconductor substrate 10 when the semiconductor substrate 10 is rotating at a low speed. This is considered that because a centrifugal force applied to the chemical liquid is weak in a case of the low speed rotation and because the chemical liquid cannot exceed the outer peripheral surplus region 52 and dwells on the outer peripheral side of the semiconductor substrate 10. Accordingly, uniformity within the surface of the semiconductor substrate 10 deteriorates.

Figure 7A:
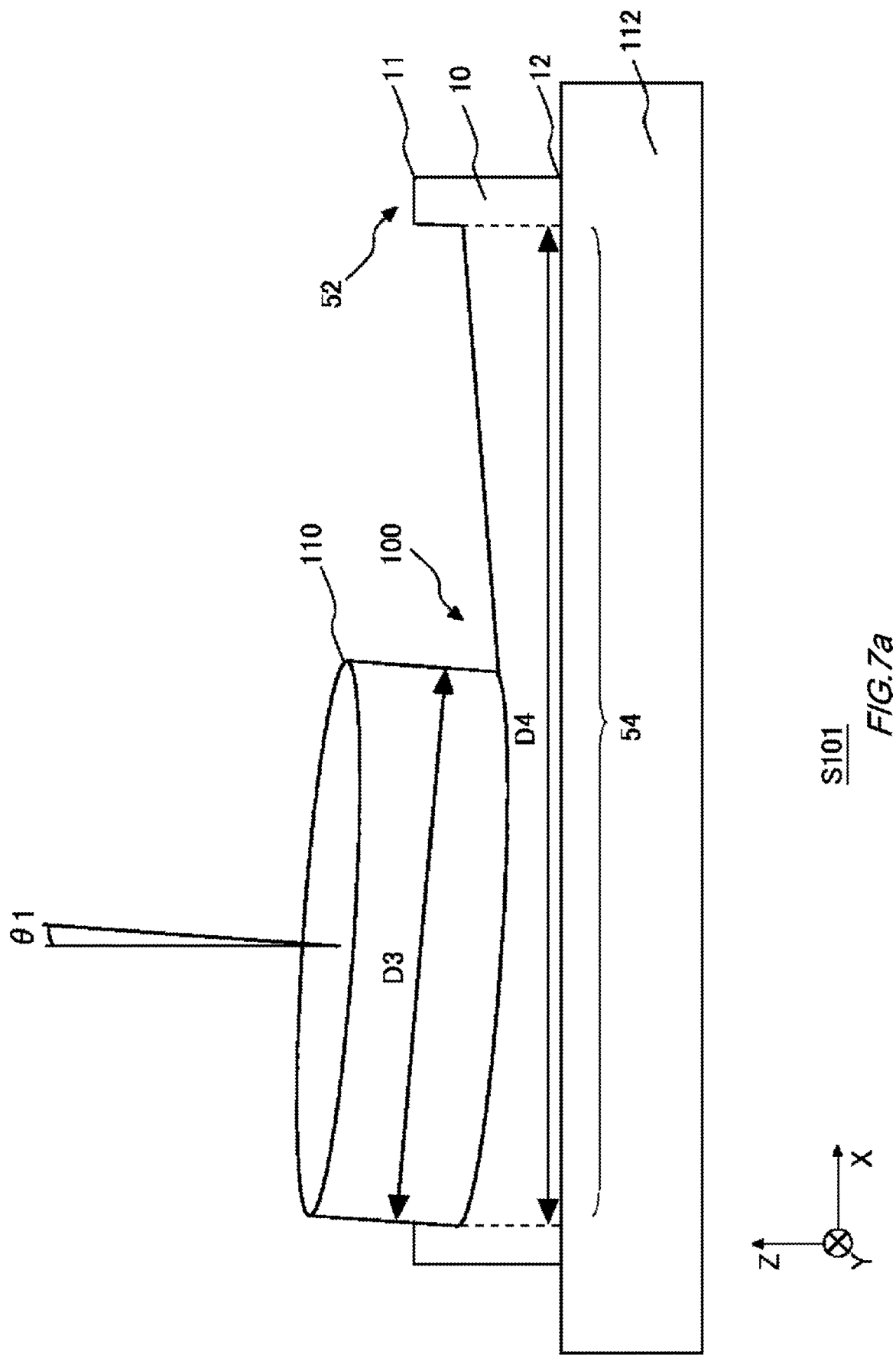
FIG. 7a is a diagram describing the semiconductor apparatus 100 in the middle of the grinding step S101 in an example embodiment.
Figure 7B:
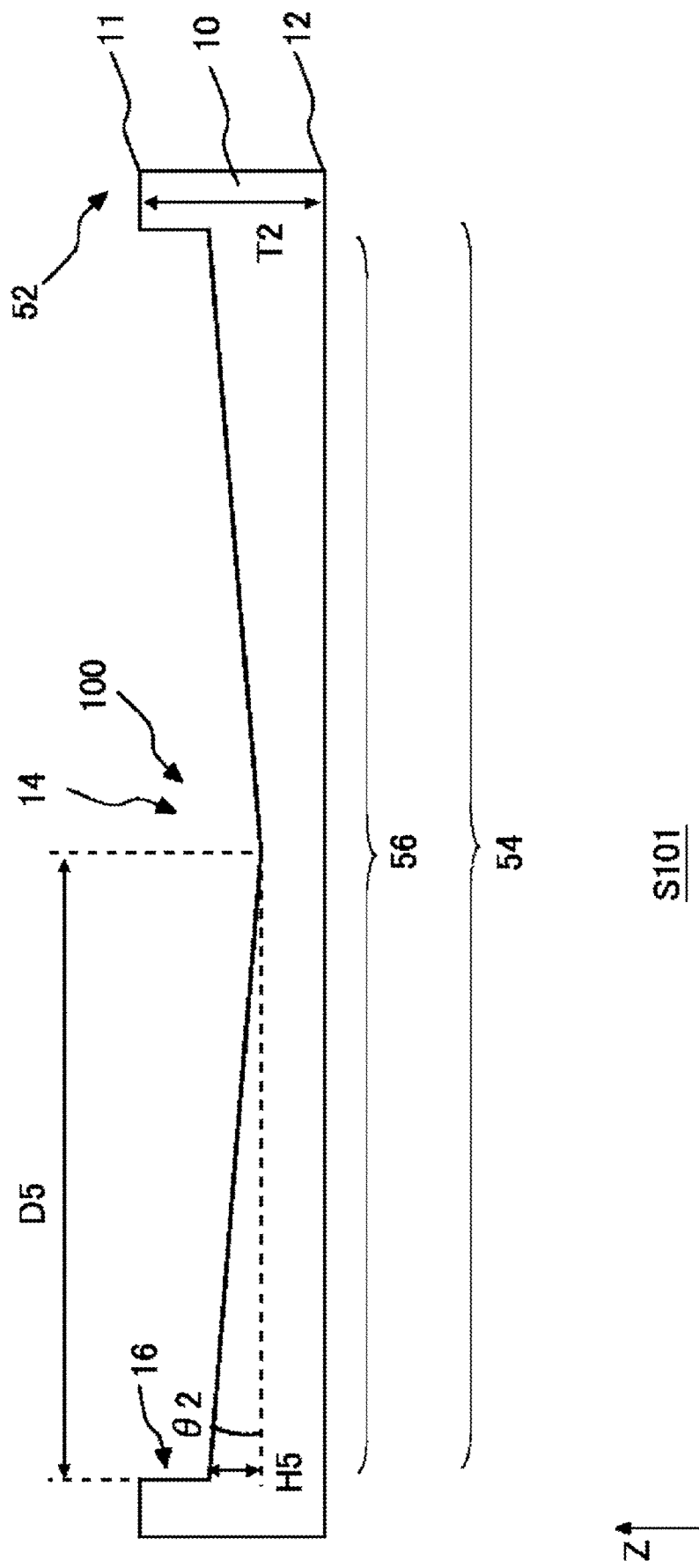
FIG. 7b is a diagram describing the semiconductor apparatus 100 after the grinding step S101 in the example embodiment.

FIG. 7a and FIG. 7b are diagrams describing the example embodiment of the grinding step S101. FIG. 7a is a diagram describing the semiconductor apparatus 100 in the middle of the grinding step S101 in an example embodiment. FIG. 7b is a diagram describing the semiconductor apparatus 100 after the grinding step S101 in the example embodiment.

In FIG. 7b, a portion including a center in an X-Y plane of the region 54 is referred to as a center portion 14. Also, a portion of an end on an X axis and a Y axis in the region 54 is referred to as an end portion 16. In FIG. 7b, in the region 54 of the semiconductor substrate which is closer to an inner side than the outer peripheral surplus region 52, a thickness of the semiconductor substrate 10 in the end portion 16 of the region 54 is greater than a thickness of the semiconductor substrate 10 in the center portion 14 of the region 54. In the present example, the thickness of the semiconductor substrate 10 monotonically decreases, in the region 54, from the end portion 16 to the center portion 14. That is, after the grinding step S101, the thickness of the semiconductor substrate 10 on the outer peripheral side is made thicker than the thickness of the semiconductor substrate 10 on the center side. In the grinding step S101, by processing the semiconductor substrate 10 in this way, the thickness of the semiconductor substrate 10 can be uniform in the spin etching step S102. Also, it enables the semiconductor substrate 10 to be processed with the low speed rotation in the spin etching step S102 and can prevent the wafer breakage.

In FIG. 7b, the semiconductor substrate 10 may have a slope portion 56 in the region 54. The slope portion 56 may be a portion whose height changes in a radial direction of the semiconductor substrate 10. The height of the slope portion 56 may be a height relative to a portion where the first surface 11 of the semiconductor substrate 10 is a minimum thickness. That is, the height of the slope portion 56 may be a height relative to the height of the first surface 11 of the semiconductor substrate 10 in the center side. In the present example, the radial direction of the semiconductor substrate 10 is the X axis direction. The radial direction of the semiconductor substrate 10 may be perpendicular to a circumferential direction of the semiconductor substrate 10. In the present example, the height of the slope portion 56 decreases toward the center side of the semiconductor substrate 10. The slope portion 56 may contact the outer peripheral surplus region 52. By forming the slope portion 56, the thickness of the semiconductor substrate 10 in the end portion 16 of the region 54 can be made thicker than the thickness of the semiconductor substrate 10 in the center portion 14 of the region 54. In the present example, the region 54 only has the slope portion 56. That is, the entire region 54 may be the slope portion 56.

To form the slope portion 56, in FIG. 7a, the semiconductor substrate 10 is ground by inclining a rotation axis of the whetstone 110 with respect to the radial direction of the semiconductor substrate 10. In an example of FIG. 7a, a lower surface of the whetstone 110 is arranged to have an inclination in an X axis direction. That is, the rotation axis of the whetstone 110 is inclined toward a direction (X axis direction) perpendicular to a direction in which the rotation axis of the whetstone 110 is inclined forward (Y axis direction). The direction in which the rotation axis of the whetstone 110 is inclined forward (Y axis direction) is described below using FIG. 12. In FIG. 7a, the rotation axis of the whetstone 110 is inclined by an angle θ1 with respect to a Z axis direction. By inclining the rotation axis of the whetstone 110 with respect to the radial direction of the semiconductor substrate 10 to grind the semiconductor substrate 10, the slope portion 56 can be formed.

A diameter D3 of the whetstone 110 may be greater than a radius of the region 54 (a half of a diameter D4 of the region 54). However, if the diameter D3 is too much greater than the radius of the region 54, a recessed portion with a concentric circle shape is formed around the center of the region 54. With the diameter D3 having approximately 110% or less of the radius of region 54, a recession quantity can be suppressed to be about 1/10 of a height H5, thus no problem occurs on a device characteristic or the like. Accordingly, the diameter D3 is preferred to be equal to or greater than the radius of the region 54 and approximately 110% or less of the radius.

In FIG. 7b, an inclination angle of the slope portion 56 is referred to as θ2. The inclination angle θ2 of the slope portion 56 is an inclination angle with respect to the radial direction of the semiconductor substrate 10. To determine the inclination angle θ2, a reference may be made to a distribution in a diameter direction of the etching amount as in FIG. 5, for example. According to FIG. 5, the etching amount tends to increase in the region around 30 mm from the outer peripheral side of the semiconductor substrate 10. In particular, the etching amount increases greatly in the region around 15 mm from the outer peripheral side of the semiconductor substrate 10. There is no specific numerical value shown in FIG. 5, but a difference between a maximum value of the etching amount and a minimum value of the etching amount is 50 μm or less. In this way, the inclination angle θ2 of the slope portion 56 may be 1 degree or less. The inclination angle θ2 of the slope portion 56 may be 0.1 degree or less. By causing the inclination angle θ2 of the slope portion 56 to be 1 degree or less, the slope portion 56 can be formed over a wide range in the region 54.

Also, a height of the slope portion 56 is referred to H5. The height H5 of the slope portion 56 may be a maximum height of the slope portion 56. The height H5 of the slope portion 56 may be a height of a portion within the slope portion 56 which contacts the outer peripheral surplus region 52. The height H5 of the slope portion 56 may be determined from the difference between the maximum value of the etching amount and the minimum value of the etching amount of FIG. 5. The difference between the maximum value of the etching amount and the minimum value of the etching amount was described to have 50 μm or less, but according to an investigation of inventors of the invention, it has been found that the difference can be adjusted to be 20 μm or less by adjusting the apparatus. Accordingly, the height H5 of the slope portion 56 may be 50 μm or less. The height H5 of the slope portion 56 may be 20 μm or less. The height H5 of the slope portion 56 may be equal to or less than the thickness of the semiconductor substrate 10. For example, the height H5 of the slope portion 56 is equal to or less than the thickness T2 of the semiconductor substrate 10 in the outer peripheral surplus region 52.

Also, a width of the slope portion is referred to as D5. In FIG. 7b, the width D5 of the slope portion 56 is a width in the radial direction of the slope portion 56 in a circumferential direction of the semiconductor substrate 10. The width D5 of the slope portion 56 may be 15 mm or more. The width D5 of the slope portion 56 may be 20 mm or more. The width D5 of the slope portion 56 may be 30 mm or more. The width D5 of the slope portion 56 may be 100 mm or more. The width D5 of the slope portion 56 may be 10% or more of the radius of the semiconductor substrate 10 (a half of the diameter D1 of the semiconductor substrate 10). Causing the height H5 of the slope portion 56 and the width D5 of the slope portion 56 to have such values enables the inclination angle of the slope portion 56 to be 1 degree or less.

Figure 8A:
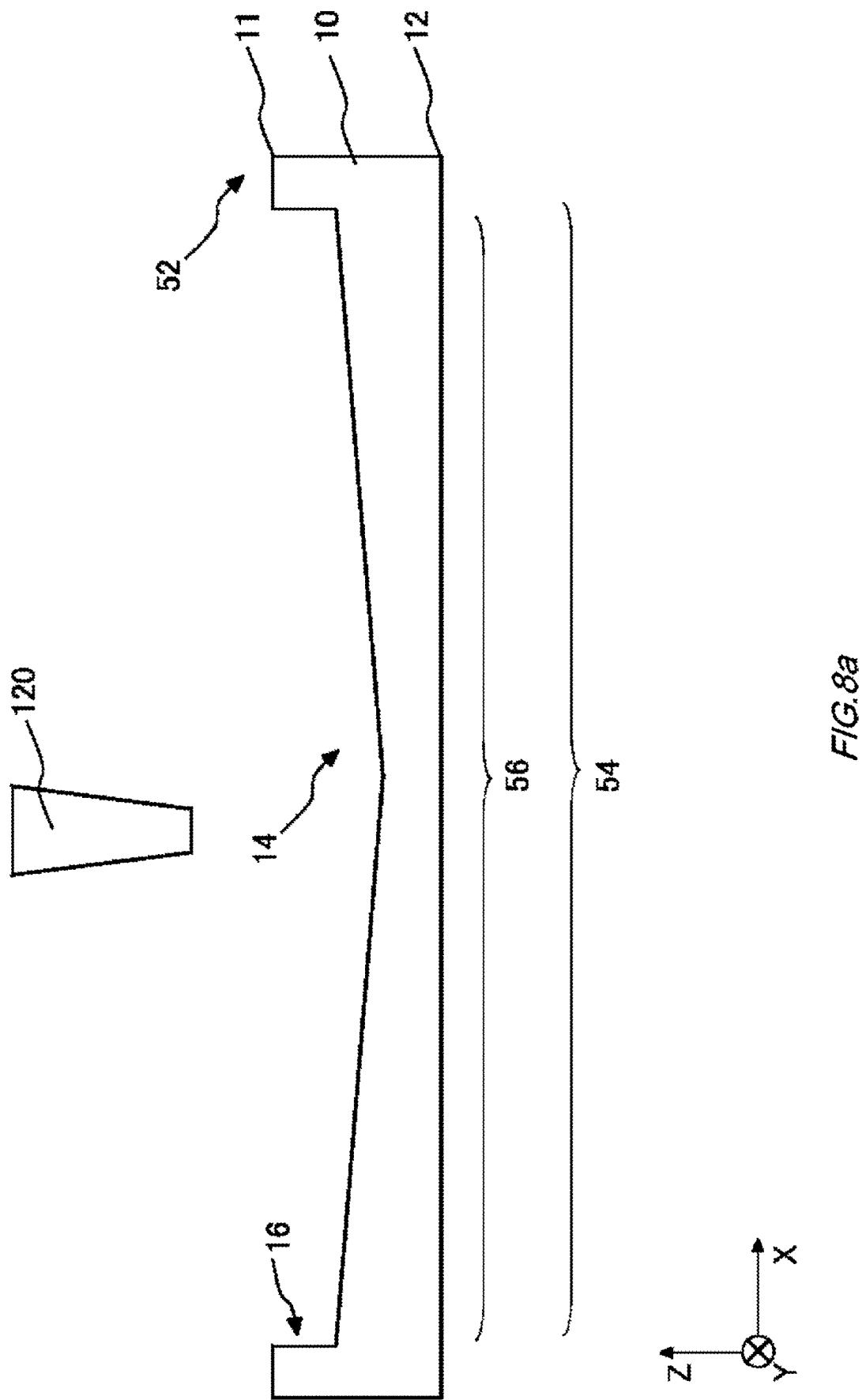
FIG. 8a is a diagram describing the semiconductor apparatus 100 in the middle of the processing in the spin etching step S102.
Figure 8B:
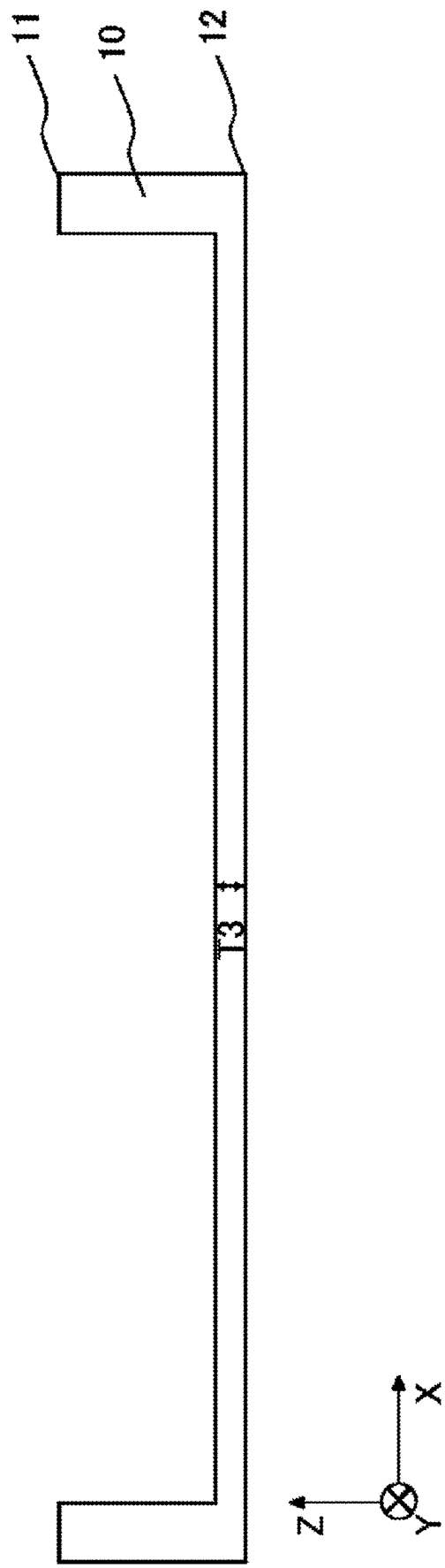
FIG. 8b is a diagram describing the semiconductor apparatus 100 after the processing in the spin etching step S102.

FIG. 8a and FIG. 8b are diagrams describing the example embodiment of the spin etching step S102. FIG. 8a is a diagram describing the semiconductor apparatus 100 in the middle of the processing in the spin etching step S102. FIG. 8b is a diagram describing the semiconductor apparatus 100 after the processing in the spin etching step S102. Note that a spin etching processing in FIG. 8a may be the same as the spin etching processing in FIG. 4a.

As shown in FIG. 8b, since the thickness of the semiconductor substrate 10 in the outer peripheral side is thicker than the thickness of the semiconductor substrate 10 in the center side in the grinding step S101, the thickness T3 of the semiconductor substrate 10 can be uniform in the spin etching step S102. Also, it enables the semiconductor substrate 10 to be processed with the low speed rotation in the spin etching step S102 and can prevent the wafer breakage.

Figure 9A:
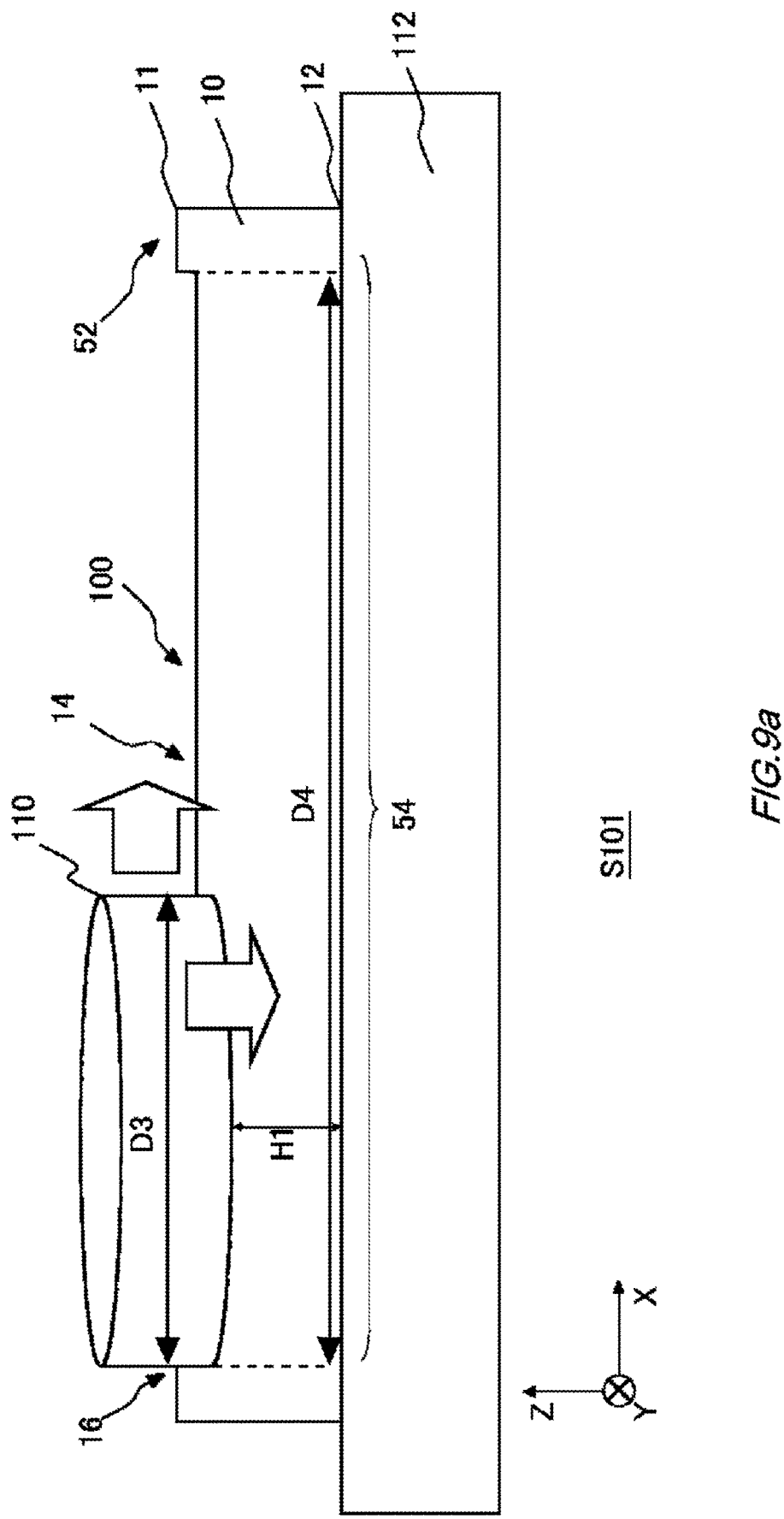
FIG. 9a is a diagram describing the semiconductor apparatus 100 in the middle of the grinding step S101 in another example.
Figure 9B:
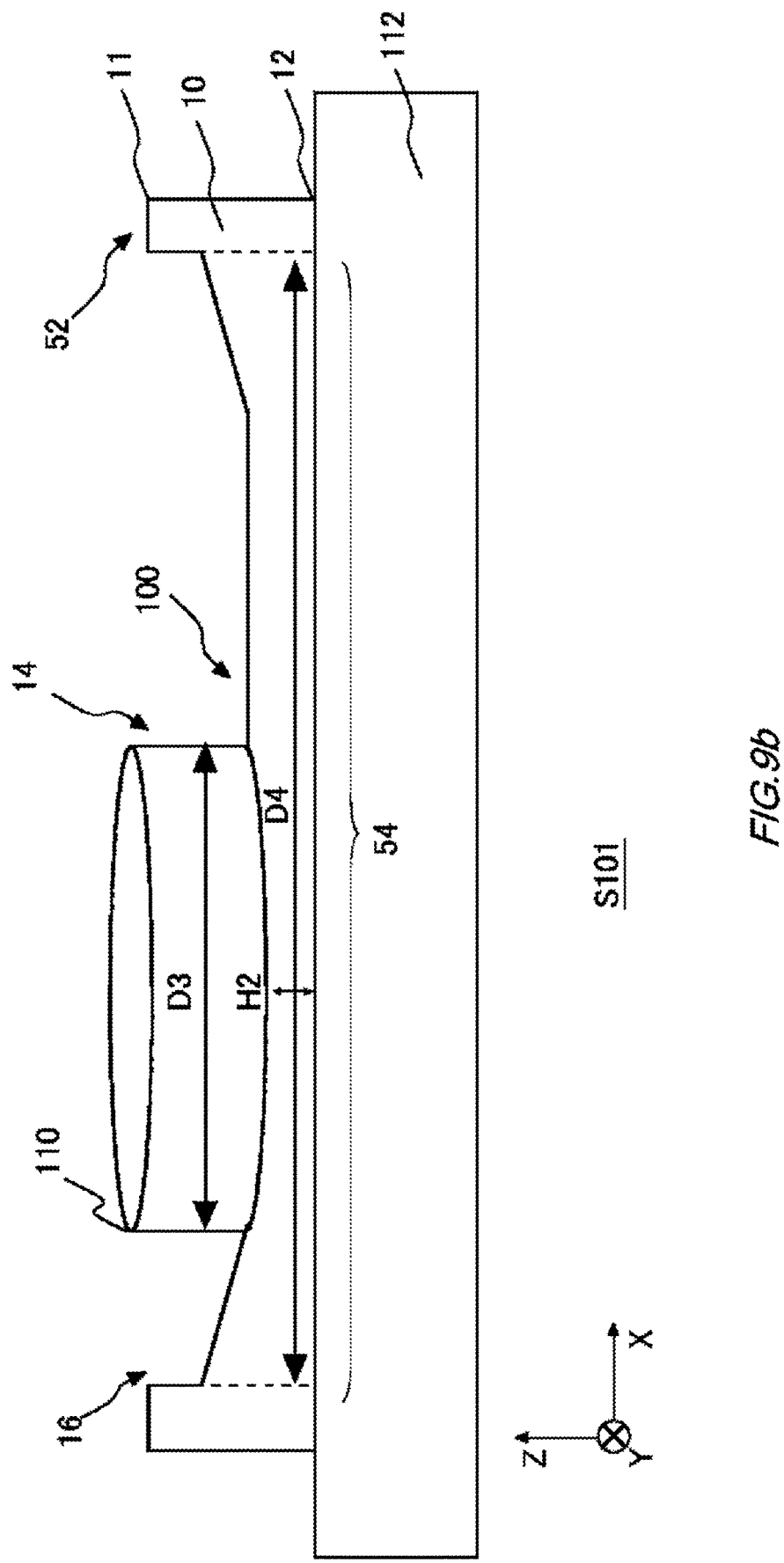
FIG. 9b is a diagram describing the semiconductor apparatus 100 in the middle of the grinding step S101 in another example.
Figure 9C:
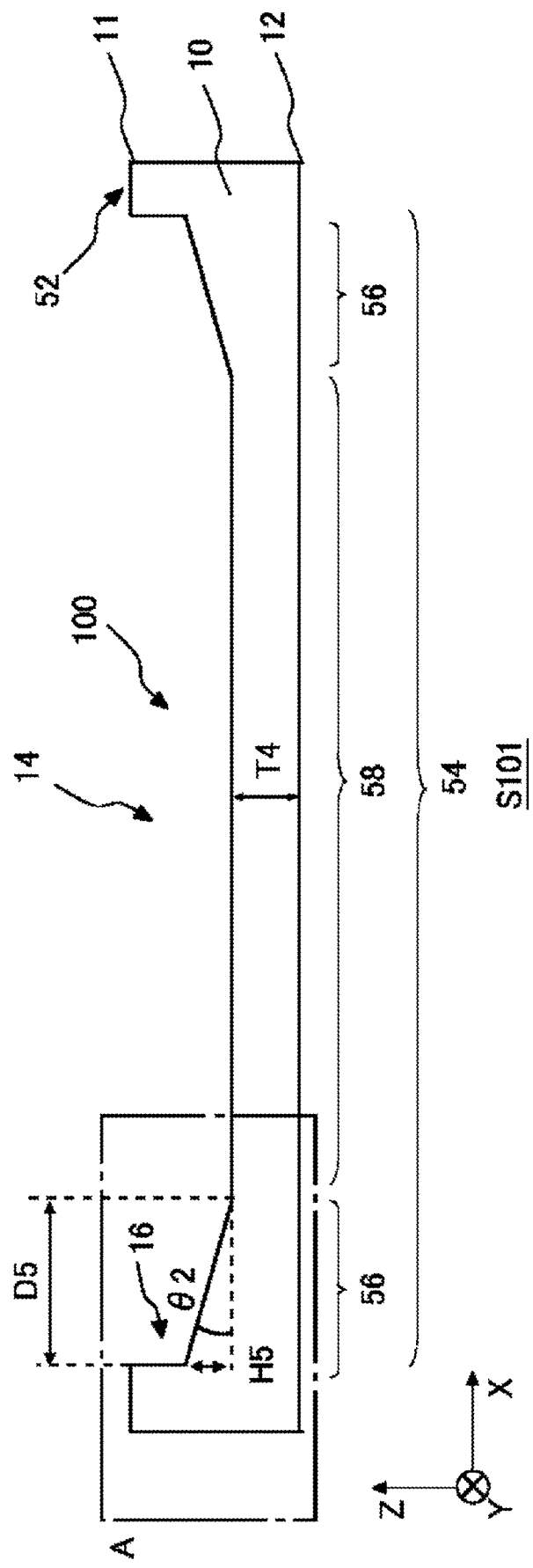
FIG. 9c is a diagram describing the semiconductor apparatus 100 after the grinding step S101 in another example.

FIG. 9a, FIG. 9b and FIG. 9c are diagrams describing another example of the grinding step S101. FIG. 9a shows a state of the semiconductor substrate 10 when the grinding is started. FIG. 9b shows a state of the semiconductor substrate 10 when the grinding ends. FIG. 9c is a diagram describing the semiconductor apparatus 100 after the grinding step S101.

As shown in FIG. 9a and FIG. 9b, in the grinding step S101, the semiconductor substrate 10 is ground while the whetstone 110 is moving from the end portion 16 of the region 54 to a side of the center portion 14 of the region 54. In the present example, the whetstone 110 is moving toward the center side of the semiconductor substrate 10 in the circumferential direction of the semiconductor substrate 10. By moving the whetstone 110 to grind the semiconductor substrate 10, the slope portion 56 can be formed on the semiconductor substrate 10.

Also, in the present example, as the whetstone 110 moves toward the center side, a position of the whetstone 110 becomes lower. The height H2 of the whetstone 110 from a table 112 in FIG. 9b is lower than the height H1 of the whetstone 110 from a table 112 in FIG. 9a. By moving the whetstone 110 in such a manner, the slope portion 56 can be easily formed.

Also, the diameter D3 of the whetstone 110 is required to be the radius of the region 54 (a half of the diameter D4 of the region 54) or more. However, since formation of a grind trace becomes problematic if the D3 is too great, the D3 is preferred to be less than about 110% of the radius of the region 54. The diameter D3 of the whetstone 110 may be 100% or more and less than 110% of the radius of the region 54, as one example.

Note that, as shown in FIG. 9c, the region 54 may have a flat portion 58 in addition to the slope portion 56. The flat portion 58 may be a region where the thickness T4 of the semiconductor substrate 10 is uniform. The flat portion 58 may be surrounded by the slope portion 56. The thickness T4 of the semiconductor substrate 10 in the flat portion 58 may be the thickness of the semiconductor substrate 10 in the center portion 14.

Also, as with FIG. 7b, the inclination angle θ2 of the slope portion 56 may be 1 degree or less. As with FIG. 7b, the height H5 of the slope portion 56 may be 20 μm or less. As with FIG. 7b, the width D5 of the slope portion 56 may be 15 mm or more.

Figure 10:
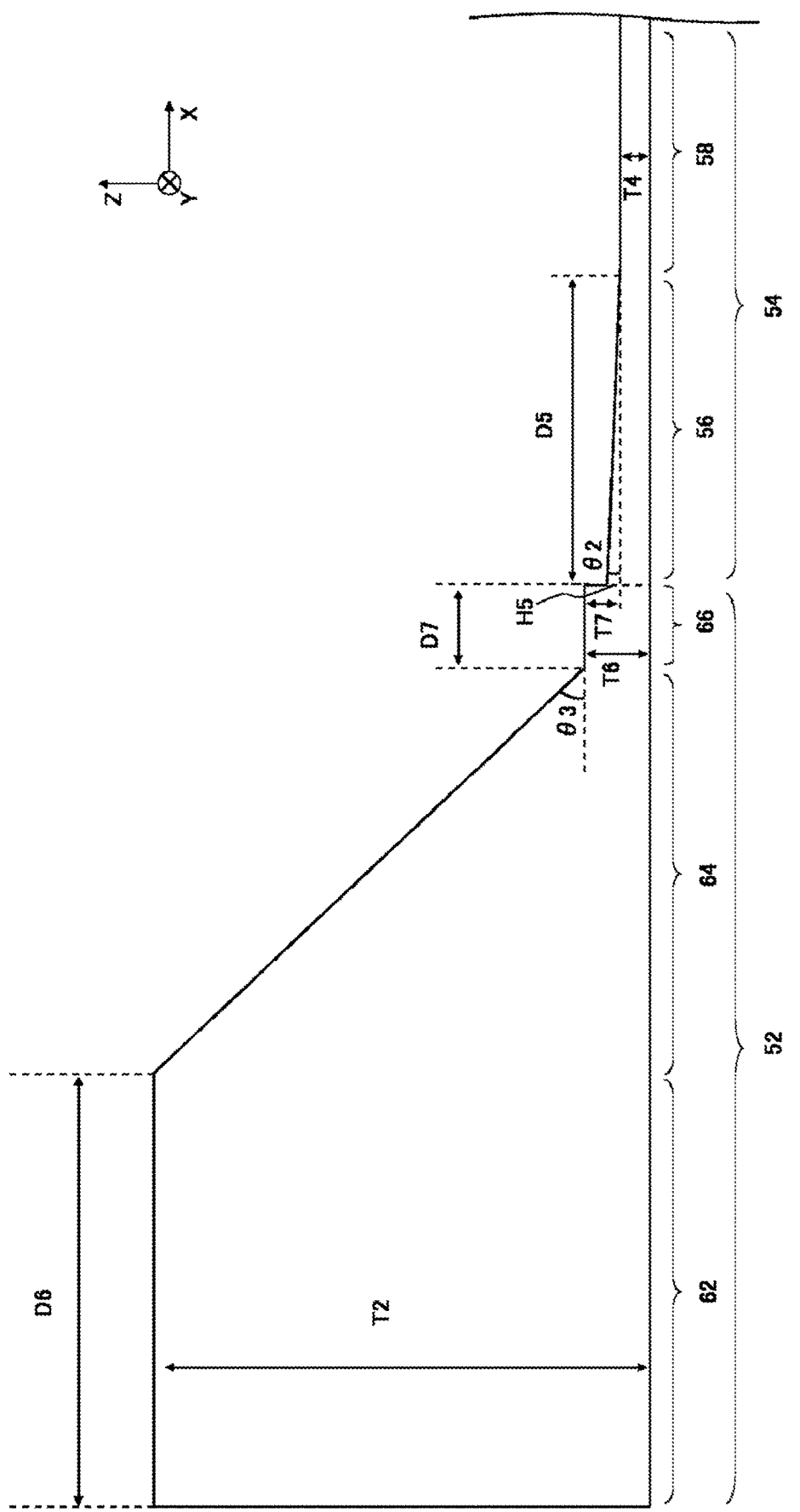
FIG. 10 is a diagram describing a region A in FIG. 9c in detail.

FIG. 10 is a diagram describing a region A in the FIG. 9c in detail. In FIG. 9c, the region A is a region which is surrounded with dashed line. In FIG. 10, the semiconductor substrate 10 has an outer peripheral surplus region 52, a slope portion 56, and a flat portion 58. In FIG. 10, the outer peripheral surplus region 52 which was omitted in FIG. 9c is shown in detail. FIG. 7b and the following FIG. 11b may also have a structure with the outer peripheral surplus region 52 which is the same as that of FIG. 10. Note that, in the grinding step S101 of FIG. 10, FIG. 10 is one example of processing using the biaxial grinding apparatus, and FIG. 10 does not have similar shape when the grinding step S101 is performed using a grinding apparatus with another manner. The biaxial grinding apparatus may be an apparatus including two rotation axis of the whetstone 110, and in the grinding step S101, the grinding may be firstly performed using the rotation axis with a rough whetstone 110 with large abrasive grain size attached thereon, and then a subsequent grinding is performed using the rotation axis with a whetstone 110 with small abrasive grain size attached thereon. Using a whetstone with large abrasive grain size causes a throughput of the grinding step S101 to improve, but it also causes the thickness of the processing distortion layer to increase. Using a whetstone 110 with small abrasive grain size causes a throughput of the grinding step S101 to decrease, but it can decrease the thickness of the processing distortion layer. In the present example, a shape of the outer peripheral surplus region 52 is described in detail. The outer peripheral surplus region 52 in FIG. 7b may have a shape similar. Note that, a shape and diameter of the semiconductor substrate 10 in FIG. 10 does not necessarily match with a shape and diameter of the semiconductor substrate 10 in FIG. 9c.

The outer peripheral surplus region 52 may have a slope portion 64. In the present example, the outer peripheral surplus region 52 may have a first portion 62, a slope portion 64 and a second portion 66. The first portion 62 and the second portion 66 may be portions where a thickness in the radial direction of the semiconductor substrate 10 is uniform. The slope portion 64 may be a portion whose thickness changes in a radial direction of the semiconductor substrate 10. In the present example, the radial direction is an X axis direction.

A width of the first portion 62 is referred to as D6. In FIG. 10, the width D6 of the first portion 62 is a width in a radial direction of the first portion 62 in the circumferential direction of the semiconductor substrate 10. The width D6 of the first portion 62 may be 1 mm or more and 5 mm or less. Also, a thickness of the semiconductor substrate 10 in the first portion 62 may be referred to as the thickness T2 of the semiconductor substrate 10 in the outer peripheral surplus region 52. The thickness T2 may be 700 μm or more and 800 μm or less, as one example.

In FIG. 10, an inclination angle of the slope portion 64 is referred to as θ3. The inclination angle θ3 of the slope portion 64 may be 30 degrees or greater. The inclination angle θ3 of the slope portion 64 may be 45 degrees or less. That is, the inclination angle θ3 of the slope portion 64 of the outer peripheral surplus region 52 may be greater than the inclination angle θ2 of the slope portion 56 of the region 54. The inclination angle θ3 of the slope portion 64 of the outer peripheral surplus region 52 may be 30 times or more of the inclination angle θ2 of the slope portion 56 of the region 54. Accordingly, the slope portion 64 of the outer peripheral surplus region 52 and the slope portion 56 of the region 54 can be distinguished. Note that the inclination angle θ3 of the slope portion 64 of the outer peripheral surplus region 52 is not limited to the example of 30 degrees or more and 45 degrees or less. The inclination angle θ3 of the slope portion 64 of the outer peripheral surplus region 52 may be 80 degrees or more. That is, the slope portion 64 of the outer peripheral surplus region 52 may be almost perpendicular with respect to the second portion 66.

A width of the second portion 66 is referred to as D7. In FIG. 10, the width D7 of the second portion 66 is a width in a radial direction of the second portion 66 in the circumferential direction of the semiconductor substrate 10. The width D7 of the second portion 66 may be 0.1 mm or more and 1.0 mm or less.

Also, a thickness of the semiconductor substrate 10 in the second portion 66 is referred to as T6. A difference between the thickness T6 of the semiconductor substrate 10 in the second portion 66 and the thickness T4 of the semiconductor substrate 10 in the flat portion 58 is referred to as a thickness T7. The thickness T7 may be 30 μm or more. The thickness T7 may be 80 μm or less. Note that, the thickness T4 of the semiconductor substrate 10 in the flat portion 58 may be 60 μm or more. The thickness T4 of the semiconductor substrate 10 of the flat portion 58 may be 350 μm or less.

Figure 11A:
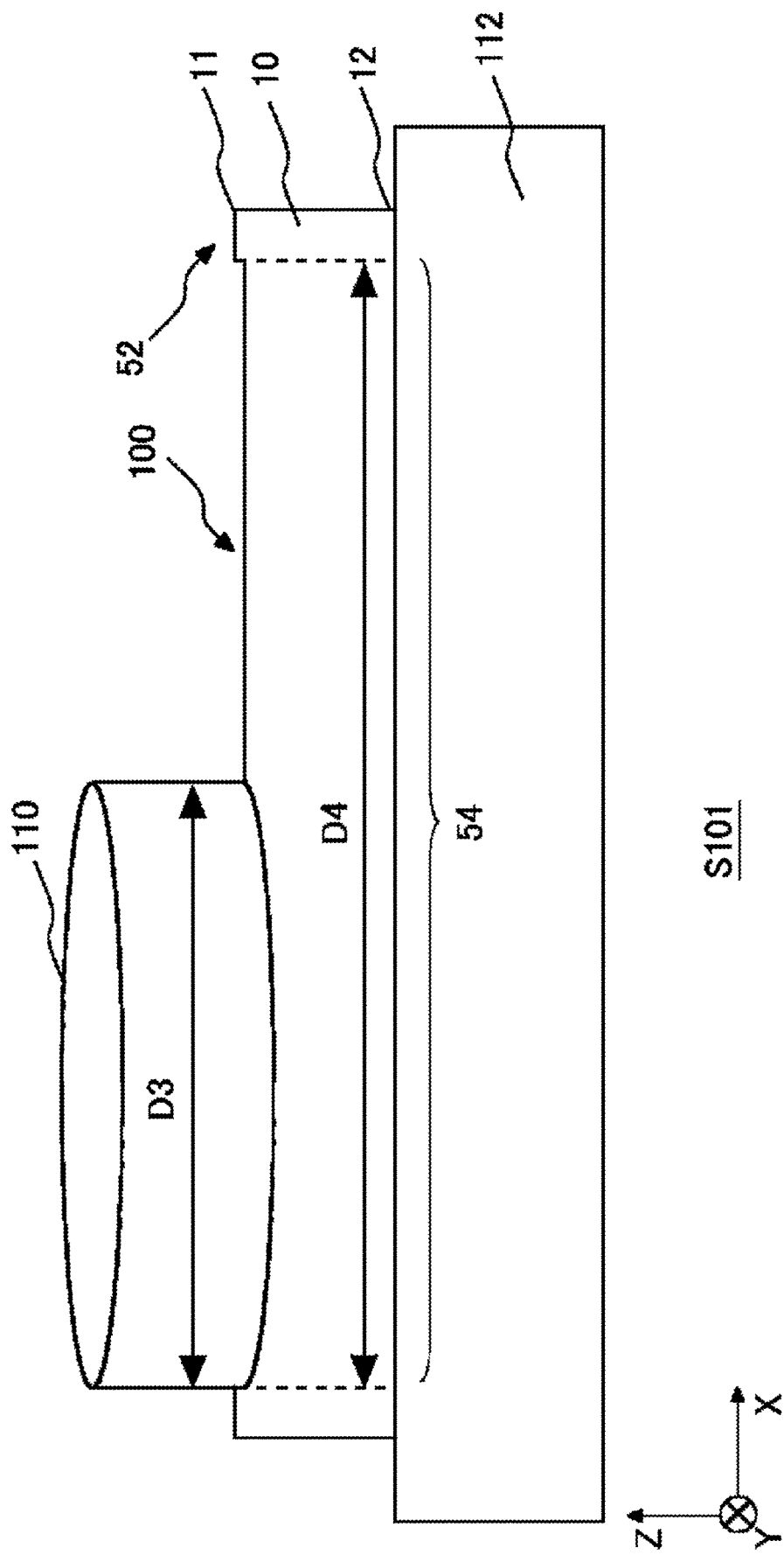
FIG. 11a is a diagram describing the semiconductor apparatus 100 in the middle of the grinding step S101 in another example.
Figure 11B:
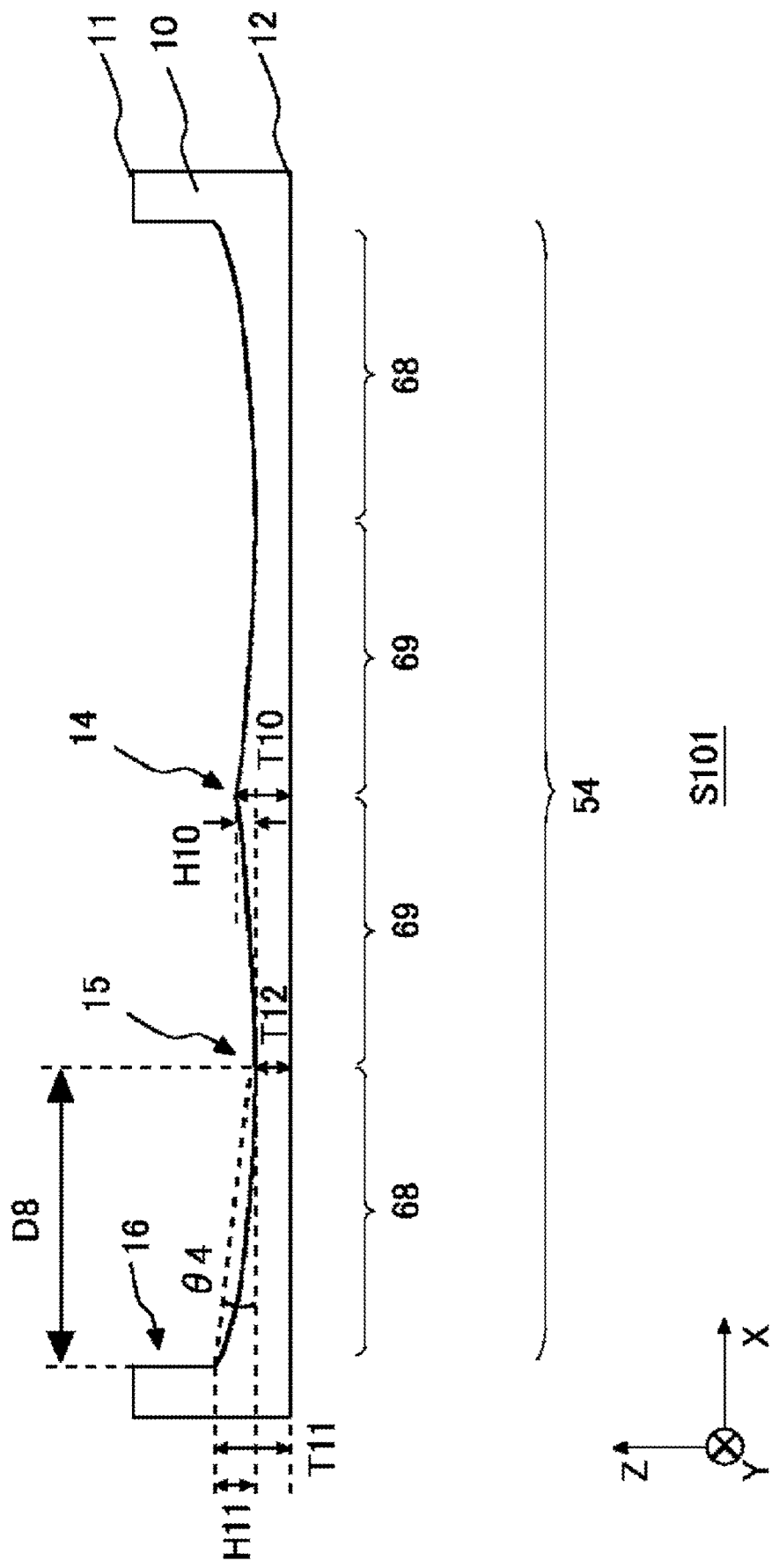
FIG. 11b is a diagram describing the semiconductor apparatus 100 after the grinding step S101 in another example.

FIG. 11a and FIG. 11b are diagrams describing another example of the grinding step S101. FIG. 11a shows a state of the semiconductor substrate 10 when the grinding is started. FIG. 11b is a diagram describing the semiconductor apparatus 100 after the grinding step S101.

In the present example, the first surface 11 is ground, in a state shown in FIG. 11a, with the rotation axis of the whetstone 110 inclined forward. Inclining the rotation axis of the whetstone 110 forward refers to inclining the lower surface of the whetstone 110 with respect to the circumferential direction of the semiconductor substrate 10. In the present example, the circumferential direction of the semiconductor substrate 10 is the Y axis direction. The lower surface of the whetstone 110 in the present example has an inclination in a Y-Z plane. In the present example, the lower surface of the whetstone 110 is arranged to have an inclination with respect to the Y axis direction (forward inclination angle). The forward inclination angle is described below in FIG. 12. By inclining the rotation axis of the whetstone 110 forward to grind the first surface 11, a slope portion contacting the outer peripheral surplus region 52 can be formed on the semiconductor substrate 10.

In FIG. 11*b*, a portion including a center in an X-Y plane of the region 54 is referred to as a center portion 14. Also, a portion of an end on an X axis and a Y axis in the region 54 is referred to as an end portion 16. In the present example, the first surface 11 may have a downward convex parabolic shape between the center portion 14 and the end portion 16 on an X-Z plane of the region 54 passing through the center portion 14. In the present example, a thickness of the semiconductor substrate 10 in the center portion 14 is referred to as T10. Also, a thickness of the semiconductor substrate 10 in the end portion 16 is referred to T11. Also, between the center portion 14 and end portion 16, a portion where the thickness of the semiconductor substrate 10 is the thinnest is referred to as a thin portion 15, and a thickness of the semiconductor substrate 10 in the thin portion 15 is referred to as T12. The first surface 11 between the end portion 16 and the thin portion 15 is referred to as a slope portion 68, and a height of the slope portion 68 is referred to as H11. The thickness of the semiconductor substrate 10 monotonically decreases from the end portion 16 toward the thin portion 15. That is, the height H11 of the slope portion 68 may be the height of the end portion 16. The height H11 may be a difference between the thickness T11 and the thickness T12. Also, the first surface 11 between the center portion 14 and the thin portion 15 is referred to as a slope portion 69, and a height of the slope portion 69 is referred to as H10. The thickness of the semiconductor substrate 10 monotonically decreases from the center portion 14 toward the thin portion 15. That is, the height H10 of the slope portion 69 may be the height of the center portion 14. The height H10 of the slope portion 69 may be a difference between the thickness T10 and the thickness T12. The slope portion 68 and the slope portion 69 may be portions whose height changes in a radial direction of the semiconductor substrate 10.

In FIG. 11*b*, an inclination angle of the slope portion 68 is referred to as θ4. The inclination angle θ4 of the slope portion 68 may be an angle with respect to a reference surface when the thin portion 15 and the end portion 16 are connected with a straight line. The reference surface is, for example, a surface which is parallel to the second surface 12 of the semiconductor substrate 10. In addition, a width of the slope portion 68 is referred to as D8. The width D8 of the slope portion 68 may be a width between the end portion 16 and the thin portion 15.

In the present example, the center portion 14 has a convex shape as shown in FIG. 11*b*, but according to the inventors' experiment, it is found that the height H10 can be made smaller compared to the height H11 by causing the diameter D3 of the whetstone 110 to be greater than the radius of the region 54 (a half of the diameter D4 of the region 54). As one example, the H10 was able to be caused to be about 20% or less of the H11 by causing the diameter D3 of the whetstone 110 to be 110% or more of the radius of the region 54. That is, it is found that, by causing the diameter D3 of the whetstone 110 to be 110% or more of the radius of the region 54, T12<T10<T11 can be satisfied such that T10 and T11 are greater than the T12 as well as the T10 is less than the T11.

Also, it is found that the deep grinding trace of the grinding surface increases if the diameter D3 is too much greater than the radius of the region 54. As one example, by causing the diameter D3 of the whetstone 110 to be 130% or less of the radius of the region 54 in the present example, the increase of the deep grinding trace of the grinding surface in the grinding step S101 was able to be suppressed. That is, by causing the diameter D3 of the whetstone 110 to be 110% or more and 130% or less of the radius of the region 54 (a half of the diameter D4 of the region 54), a slope portion 68 with a desired height can be formed while suppressing the increase of the deep grinding trace of the grinding surface, and the height of the slope portion 69 can be made lower compared to the height of the slope portion 68. Moreover, in the grinding step S101, by processing the semiconductor substrate 10 in this way, the thickness of the semiconductor substrate 10 can be uniform in the spin etching step S102. Also, it enables the semiconductor substrate 10 to be processed with the low speed rotation in the spin etching step S102 and can prevent the wafer breakage.

Figure 12:
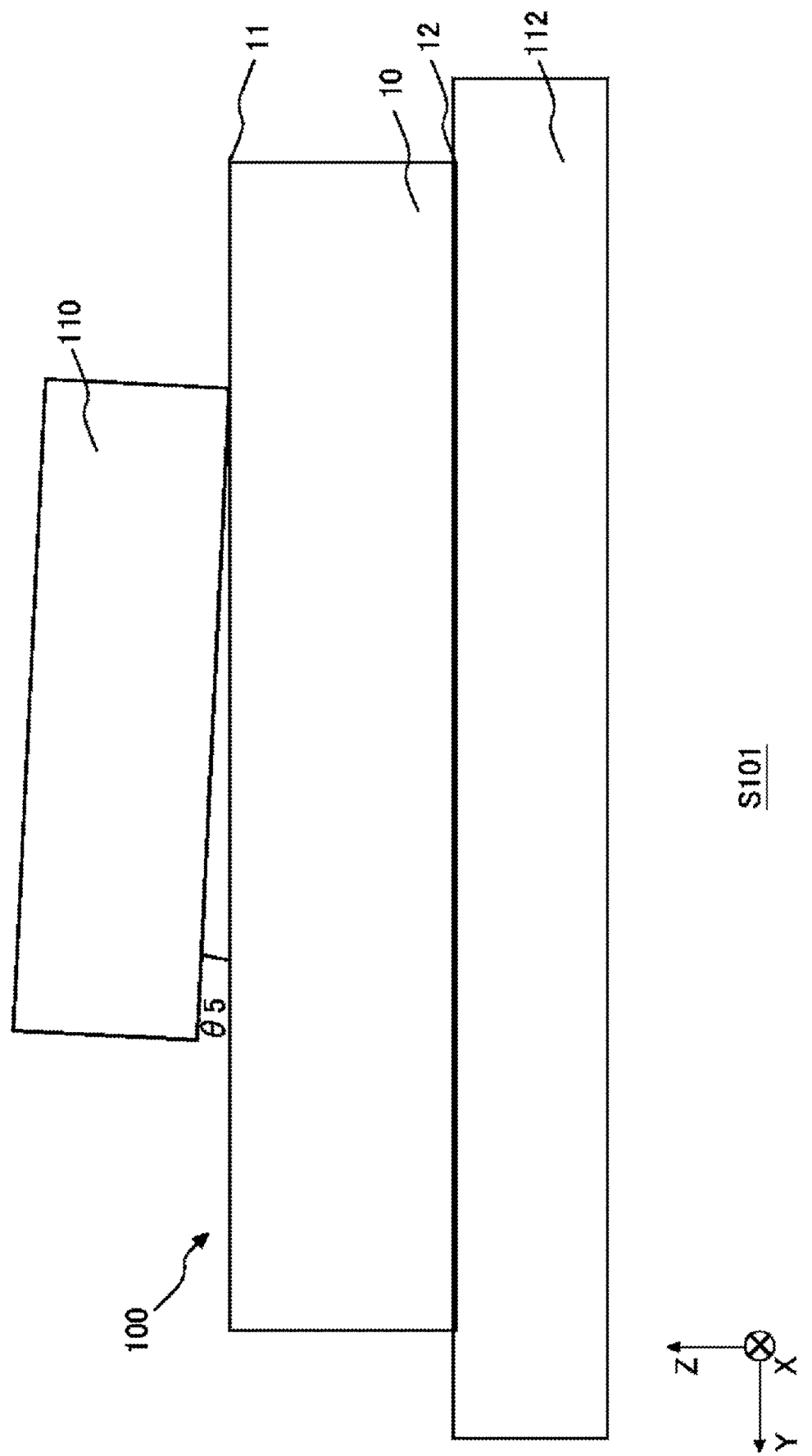
FIG. 12 is a diagram describing a forward inclination angle θ5.

Also, as with FIG. 7*b*, the inclination angle θ4 of the slope portion 68 may be 1 degree or less. As with FIG. 7*b*, the height H11 of the slope portion 68 may be 20 μm or less. As with FIG. 7*b*, the width D8 of the slope portion 68 may be 15 mm or more. FIG. 12 is a diagram describing a forward inclination angle θ5. FIG. 12 shows the grinding step S101 on the Y-Z plane. The lower surface of the whetstone 110 is arranged to have a forward inclination angle θ5 with respect to the Y axis direction.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the present invention.

What is claimed is:

1. A manufacturing method of a semiconductor apparatus comprising a semiconductor substrate, the method comprising:

grinding a first surface of the semiconductor substrate to form an outer peripheral surplus region that coincides in location with an outer periphery of the semiconductor substrate; and spin etching a ground surface, formed by grinding the first surface of the semiconductor substrate, by a chemical liquid, and wherein after the grinding, a region inward of the outer peripheral surplus region is formed, a thickness of the semiconductor substrate in an end portion of the region inward of the outer peripheral surplus region is greater than a thickness of the semiconductor substrate in a center portion of the region inward of the outer peripheral surplus region, after the grinding, the semiconductor substrate has a slope portion, located in the region inward of the outer peripheral surplus region, that contacts the outer peripheral surplus region, the slope portion has a maximum height, the outer peripheral surplus region rises in a direction perpendicular to a plane defined by a radial direction of the semiconductor substrate and a circumferential direction of the semiconductor substrate to a height greater than the maximum height of the slope portion where the slope portion contacts the outer peripheral surplus region.

2. The manufacturing method of the semiconductor apparatus according to claim 1, wherein an inclination angle of the slope portion is 1 degree or less.

3. The manufacturing method of the semiconductor apparatus according to claim 1, wherein a height of the slope portion is 20 μm or less.

4. The manufacturing method of the semiconductor apparatus according to claim 2, wherein a height of the slope portion is 20 μm or less.

5. The manufacturing method of the semiconductor apparatus according to claim 1, wherein a width of the slope portion is 15 mm or more.

6. The manufacturing method of the semiconductor apparatus according to claim 2, wherein a width of the slope portion is 15 mm or more.

7. The manufacturing method of the semiconductor apparatus according to claim 1, wherein a width of the slope portion is 10% or more of a radius of the semiconductor substrate.

8. The manufacturing method of the semiconductor apparatus according to claim 2, wherein a width of the slope portion is 10% or more of a radius of the semiconductor substrate.

9. The manufacturing method of the semiconductor apparatus according to claim 1, wherein the semiconductor substrate has a diameter of 300 mm or more.

10. The manufacturing method of the semiconductor apparatus according to claim 1, wherein in the grinding, the semiconductor substrate is ground by inclining a whetstone with respect to a radial direction of the semiconductor substrate.

11. The manufacturing method of the semiconductor apparatus according to claim 1, wherein in the grinding, the semiconductor substrate is ground by moving a whetstone from the end portion of the region to the center portion of the region.

12. The manufacturing method of the semiconductor apparatus according to claim 10, wherein a diameter of the whetstone is greater than a radius of the region.

13. The manufacturing method of the semiconductor apparatus according to claim 11, wherein a diameter of the whetstone is greater than a radius of the region.

14. A manufacturing method of a semiconductor apparatus comprising a semiconductor substrate, the method comprising:

grinding a first surface of the semiconductor substrate to form an outer peripheral surplus region that coincides in location with an outer periphery of the semiconductor substrate; and spin etching a ground surface, formed by grinding the first surface of the semiconductor substrate, by a chemical liquid, and wherein after the grinding, a region inward of the outer peripheral surplus region is formed, a thickness of the semiconductor substrate in an end portion of the region inward of the outer peripheral surplus region is greater than a thickness of the semiconductor substrate in a center portion of the region inward of the outer peripheral surplus region, during the grinding, the semiconductor substrate is ground using a whetstone that is rotated about an axis of rotation and has a grinding surface that participates in the grinding, the axis of rotation of the whetstone is perpendicular to the grinding surface, and the grinding surface is inclined with respect to one of a radial direction of the semiconductor substrate and a circumferential direction of the semiconductor substrate.

15. The manufacturing method of the semiconductor apparatus according to claim 14, wherein in the grinding, the semiconductor substrate is ground by inclining the grinding surface of the whetstone with respect to a circumferential direction of the semiconductor substrate, and a diameter of the whetstone is 110% or more and 130% or less of a radius of the region inward of the outer peripheral surplus region.

* * * * *